(12) United States Patent
Shitara

(10) Patent No.: US 9,312,833 B2
(45) Date of Patent: Apr. 12, 2016

(54) WIRELESS CIRCUIT, AND METHOD FOR CONTROLLING WIRELESS CIRCUIT

(71) Applicant: SHARP KABUSHIKI KAISHA, Osaka-shi, Osaka (JP)

(72) Inventor: Shoichi Shitara, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 14/389,920

(22) PCT Filed: Aug. 2, 2013

(86) PCT No.: PCT/JP2013/070979
§ 371 (c)(1),
(2) Date: Oct. 1, 2014

(87) PCT Pub. No.: WO2014/045729
PCT Pub. Date: Mar. 27, 2014

(65) Prior Publication Data
US 2015/0072626 A1 Mar. 12, 2015

(30) Foreign Application Priority Data

Sep. 20, 2012 (JP) ................. 2012-207595

(51) Int. Cl.
| | |
|---|---|
| H04B 1/00 | (2006.01) |
| H04B 1/04 | (2006.01) |
| H03J 7/02 | (2006.01) |
| H04B 1/18 | (2006.01) |
| H03H 7/40 | (2006.01) |

(52) U.S. Cl.
CPC .. *H03J 7/02* (2013.01); *H03H 7/40* (2013.01); *H04B 1/0057* (2013.01); *H04B 1/0458* (2013.01); *H04B 1/18* (2013.01); *H03J 2200/06* (2013.01)

(58) Field of Classification Search
CPC .... H04B 1/0053; H04B 1/006; H04B 1/0458; H03H 7/25; H03H 7/463
See application file for complete search history.

(56) References Cited

U.S. PATENT DOCUMENTS

| | | | |
|---|---|---|---|
| 9,143,172 B2* | 9/2015 | See ........................ | H03F 1/565 |
| 2002/0101907 A1* | 8/2002 | Dent ....................... | H03F 3/24 |
| | | | 375/132 |
| 2005/0227633 A1* | 10/2005 | Dunko .................. | H01Q 1/242 |
| | | | 455/90.3 |
| 2007/0149146 A1* | 6/2007 | Hwang .................. | H01Q 1/242 |
| | | | 455/80 |
| 2008/0094149 A1* | 4/2008 | Brobston ................. | H03H 7/38 |
| | | | 333/17.3 |
| 2009/0253385 A1* | 10/2009 | Dent .................... | H04B 1/0458 |
| | | | 455/83 |
| 2010/0105425 A1 | 4/2010 | Asokan | |
| 2012/0003947 A1* | 1/2012 | Su ........................ | H04B 1/0458 |
| | | | 455/150.1 |
| 2013/0005278 A1* | 1/2013 | Black ..................... | H01Q 5/335 |
| | | | 455/77 |

(Continued)

FOREIGN PATENT DOCUMENTS

| | | |
|---|---|---|
| JP | 2012-10083 A | 1/2012 |
| JP | 2012-507190 A | 3/2012 |

*Primary Examiner* — Andrew Wendell
(74) *Attorney, Agent, or Firm* — Birch, Stewart, Kolasch & Birch, LLP

(57) ABSTRACT

According to a wireless circuit, in a case where a control section carries out switching between use frequency bands of an antenna, the control section sets, in accordance with a first set value which has been adjusted by an impedance variable matching section before the switching, a set value of an impedance variable matching section after the switching. This prevents communication, which is carried out by the wireless circuit including the variable matching section, from being cut off when the use frequency band are switched.

7 Claims, 7 Drawing Sheets

(56) References Cited

U.S. PATENT DOCUMENTS

| | | | |
|---|---|---|---|
| 2013/0181787 A1* | 7/2013 | Manssen | H01Q 1/242 333/17.3 |
| 2013/0187829 A1* | 7/2013 | Pajona | H03H 7/40 343/861 |
| 2013/0190036 A1* | 7/2013 | Zhao | H03F 1/0277 455/550.1 |

* cited by examiner

FIG. 3

|  | BAND A IMPEDANCE VARIABLE MATCHING SECTION SET VALUE | BAND B IMPEDANCE VARIABLE MATCHING SECTION SET VALUE |
|---|---|---|
| EXTERNAL ENVIRONMENT 1 | A1 | B1 |
| EXTERNAL ENVIRONMENT 2 | A2 | B2 |
| EXTERNAL ENVIRONMENT 3 | A3 | B3 |

FIG. 5

| | BAND A<br>IMPEDANCE VARIABLE<br>MATCHING SECTION<br>SET REGION | BAND B<br>IMPEDANCE VARIABLE<br>MATCHING SECTION<br>SET VALUE |
|---|---|---|
| EXTERNAL ENVIRONMENT 1 | A1 | B1 |
| EXTERNAL ENVIRONMENT 2 | A2 | B2 |
| EXTERNAL ENVIRONMENT 3 | A3 | B3 |

WIRELESS CIRCUIT, AND METHOD FOR CONTROLLING WIRELESS CIRCUIT

TECHNICAL FIELD

The present invention relates to a wireless circuit and to a method of controlling the wireless circuit.

BACKGROUND ART

In recent years, a technology for using a variable matching circuit in a communication device has been developed. Patent Literature 1 discloses a variable matching network for use in a multi-band, multi-mode communications device, comprising: a gross parameter selector configured to select a first set of parameters from a plurality of predefined gross parameters based on one or more operational conditions associated with a given signal; a matching optimizer configured to obtain a second set of parameters using an optimization algorithm based on one or more of the operational conditions; a parameter combiner configured to obtain overall matching parameters based on the first and second sets of parameters; and discrete matching circuitry configurable based on the overall matching parameters to provide dynamic, fine-tune impedance matching.

CITATION LIST

Patent Literature

Patent Literature 1
Japanese Translation of PCT International Publication, Tokuhyohei No. 2012-507190 (Publication Date: Mar. 22, 2012)

SUMMARY OF INVENTION

Technical Problem

According to such a conventional technology described above, however, there is a risk that communication may be cut off when use frequency bands are switched (e.g. during a handover) and variable matching is re-adjusted. This is because of the following consideration of the technology disclosed in Patent Literature 1: When the variable matching is re-adjusted, (i) the first set of parameters is first selected based on an operational condition and then (ii) the second set of parameters is obtained by use of the optimization algorithm. In so doing, if there is a conflict between a first set of parameters before being adjusted by the second set of parameters and a first set of parameters (optimum impedance) after being adjusted by the second set of parameters, then, in the worst case, it results in an inferior communication environment before the first set of parameters is adjusted by the second set of parameters. This may cause the communication to be cut off before the adjustment.

Specifically, according to the conventional technology, in a case where switching is made from a band A to a band B and variable matching is re-adjusted as illustrated in FIG. 7, (i) the first parameter determined based on an access technology, a frequency, and a transmitting mode or receiving mode is set in the band B and then (ii) the first parameter is adjusted by the second parameter which is determined based on the signal quality, the transmitting mode, and the receiving mode. However, as indicated by the "X" in FIG. 7, a difference between the first parameter and the second parameter is large, and consequently a connection to a base station may be cut off in a case where a signal quality is inferior when the first parameter is set.

The present invention has been made in view of the problem, and it is a primary object of the present invention to provide a technology that prevents communication, which is carried out by a wireless circuit including a variable matching section, from being cut off when use frequency bands of the wireless circuit are switched.

Solution to Problem

In order to attain the object, a wireless circuit in accordance with one aspect of the present invention is a wireless circuit to be connected to an antenna, said wireless circuit including: a variable matching section for changing, in accordance with a set value, an impedance between the antenna and the wireless circuit; matching adjusting means for adjusting, in accordance with a communication status, the set value of the variable matching section; and switching means for carrying out switching between use frequency bands of the wireless circuit, in a case where the switching means carries out switching between the use frequency bands of the wireless circuit, the switching means sets, based on a first set value of the variable matching section which first set value has been adjusted by the matching adjusting means before the switching, a set value of the variable matching section after the switching.

A method in accordance with one aspect of the present invention is a method of controlling a wireless circuit, said wireless circuit including: a variable matching section for changing, in accordance with a set value, an impedance between an antenna and the wireless circuit, said method including the steps of: (a) adjusting the set value of the variable matching section in accordance with a communication status; and (b) carrying out switching between the frequency bands of the wireless circuit, in the step (b), a set value of the variable matching section after the switching being set based on a first set value of the variable matching section which first set value has been adjusted in the step (a) before the switching.

Advantageous Effects of Invention

According to one aspect of the present invention, the set value of the variable matching section after the switching is set in accordance with the first set value of the variable matching section which has been adjusted in accordance with the communication status before the switching. This makes it possible to set, immediately after the switching, a set value in view of a communication environment, and therefore prevents the communication from being cut off when use frequency bands are switched.

BRIEF DESCRIPTION OF DRAWINGS

FIG. 3 is a view showing an example of table information to be used when use frequency bands are switched in the embodiment of the present invention.

FIG. 5 is a view showing another example of table information to be used when use frequency bands are switched in the embodiment of the present invention.

DESCRIPTION OF EMBODIMENTS

The following description will discuss an embodiment of the present invention with reference to the drawings. A wireless circuit of the present embodiment is realized as a wireless circuit installed in a mobile wireless device that wirelessly communicates with a base station by switching between a plurality of use frequency bands.

Note, however, that a device to which the wireless circuit of the present invention is to be applied is not limited to a mobile wireless device, provided that the device is capable of switching between a plurality of use frequency bands. In fact, the wireless circuit is applicable to any wireless device in general that transmits and/or receives, with the use of an antenna, carrier waves in which some type of signals are superimposed.

(Wireless Circuit)

Figure 1:
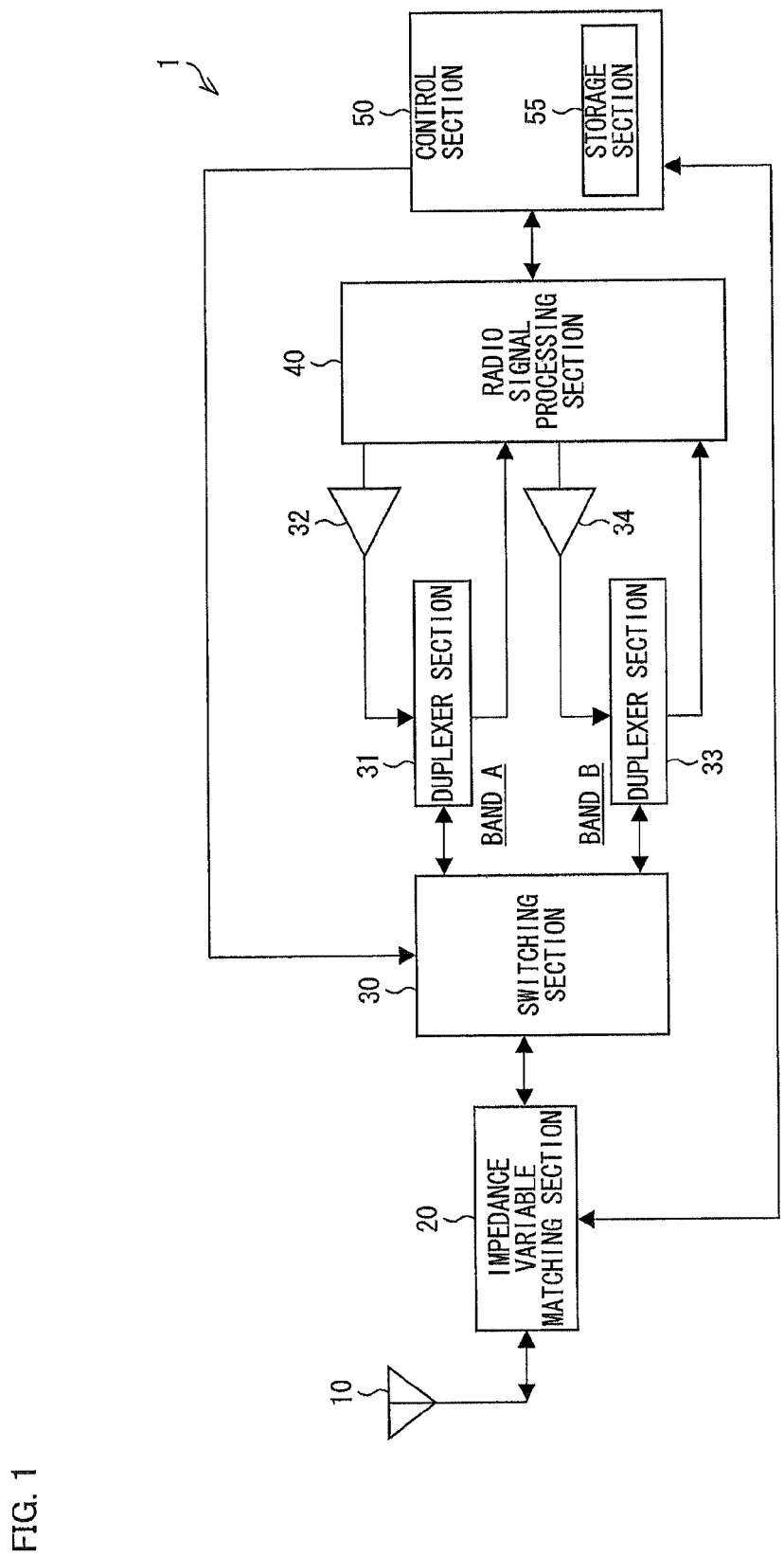
FIG. 1 is a block diagram schematically illustrating a configuration of a wireless circuit in accordance with an embodiment of the present invention.

FIG. 1 is a block diagram schematically illustrating a configuration a wireless circuit 1 in accordance with the present embodiment. As illustrated in FIG. 1, the wireless circuit 1 is connected to an antenna 10 and includes (i) an impedance variable matching section (variable matching section, matching adjusting means) 20, (ii) a switching section 30, (iii) duplexer sections 31 and 33, (iv) amplifiers 32 and 34, (v) a radio signal processing section 40, and (vi) a control section (switching means) 50.

According to the present embodiment, the wireless circuit 1 is capable of switching between two bands (frequency bands) for transmission/reception of a radio signal, which two bands are (i) a band A (first frequency band) and (ii) a band B (second frequency band). Examples of the band A and the band B encompass, but are not limited to, a 2-GHz band and an 800-MHz band of WCDMA (Registered Trademark), respectively. Note that the present invention is not limited to such an example, but can be configured such that three or more different bands are used.

In a case where the band A is a use band (use frequency band), the following is true: A signal transmitted from the radio signal processing section 40 (i) is amplified by the amplifier 32, (ii) goes through the duplexer section 31, and then (iii) is transmitted from the antenna 10. Similarly, a signal received by the antenna 10 (i) goes through the duplexer section 31, (ii) is supplied to the radio signal processing section 40, and then (iii) is processed by the radio signal processing section 40. The control section 50 controls the switching section 30 to connect the duplexer section 31 and the antenna 10.

In a case where the band B is in use, the following is true: A signal transmitted from the radio signal processing section 40 is amplified by the amplifier 34 and is then transmitted from the antenna 10 via the duplexer section 33. Similarly, a signal received by the antenna 10 is supplied to the radio signal processing section 40 via the duplexer section 33, and is processed by the radio signal processing section 40. The control section 50 controls the switching section 30 to connect the duplexer section 33 and the antenna 10.

It is the control section 50 that switches between the bands to be used. For example, in a case where, for example, a handover is conducted from a first band to a second band which is different from the first band, the control section 50 switches between the bands to be used. The control section 50 includes a storage section 55 for storing tables (described later).

The impedance variable matching section 20 (i) is connected to the antenna 10 and (ii) change, in accordance with a parameter (set value) set in the impedance variable matching section 20, an impedance between the antenna 10 and the wireless circuit 1. The impedance variable matching section 20 may include, for example, a common variable matching element. Note that according to the embodiment, the impedance variable matching section 20 may set the parameter to one of candidate values which are specified in advance. This allows the impedance variable matching section to quickly set the parameter. According to another embodiment, the impedance variable matching section 20 may set the parameter to any value. This allows the impedance variable matching section 20 to set the parameter to a more suitable value.

The impedance variable matching section 20 also serves as matching adjusting means that adjusts the parameter in accordance with a communication status. For example, the impedance variable matching section 20 includes, although not illustrated, a quality determining section (quality determining means) that monitors a signal, which is transmitted from the wireless circuit 1, to determine the quality of the signal. This allows the impedance variable matching section 20 to adjust the parameter such that the quality of the signal is optimized. Examples of factors that indicate the quality of the signal encompass transmission power, distortion characteristic, and EVM (Error Vector Magnitude). Note that the quality and the like of a signal to be received by the antenna 10 are largely affected by a radio propagation environment or the like except for variation in antenna load. Therefore, it is possible to use the signal after minimizing effects of the radio propagation path environment by securing an extended length of time window during which an average value of a measured quality of the signal is calculated. Alternatively, it is also possible to cause the control section 50, instead of the impedance variable matching section 20, to serve as matching adjusting means.

(Operation During Band Switching)

Figure 2:
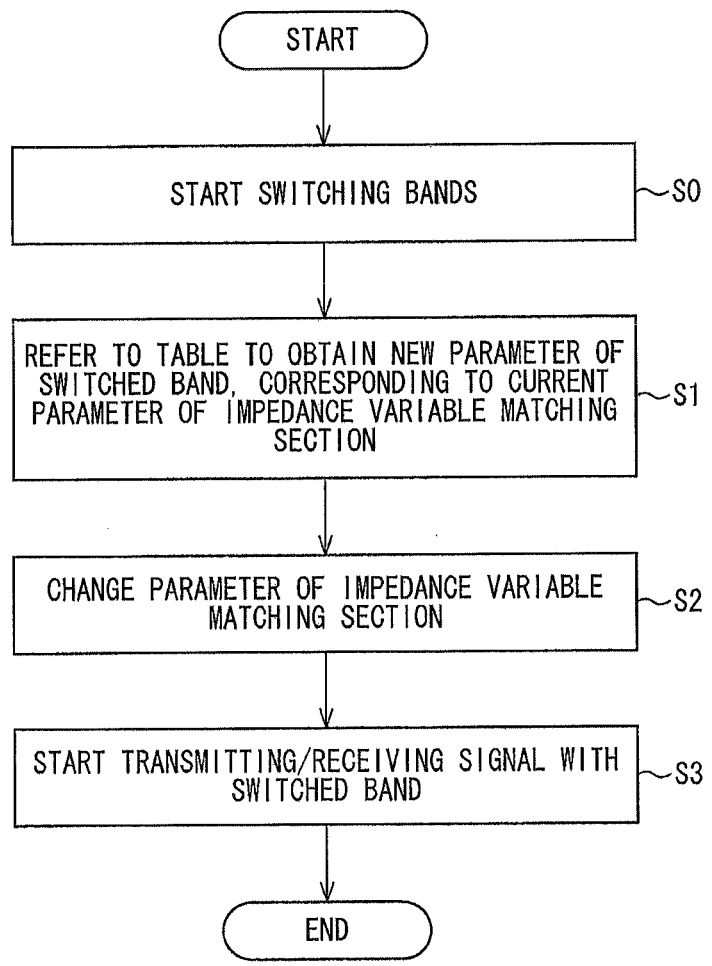
FIG. 2 is a flow chart showing an example of an operation of the wireless circuit in accordance with the embodiment of the present invention.

An operation of the wireless circuit 1 to switch between bands (use frequency band) will be described next with reference to the flow chart shown in FIG. 2. Although an operation of switching from the band A to the band B will be described as an example, it is assumed that the wireless circuit 1 in accordance with the present embodiment is capable of switching from the band B to the band A.

First, in a case where switching between the bands is initiated (Step S0), the control section 50 obtains a parameter (first set value) of the impedance variable matching section 20, which parameter has been adjusted by the matching adjusting means. Then, the control section 50 refers, to a table (table information) stored in advance in the storage section 55, (i) the parameter thus obtained, (ii) information on first band from which the switching is made, and (iii) information on second band to which the switching is made. This causes the control section 50 to obtain a parameter (second set value) which is to be set in the second band (Step S1).

Then, the control section 50 sets the parameter of the impedance variable matching section 20 to the parameter obtained in the step S1 (Step S2). Then, the control section 50 controls the switching section 30 and the radio signal processing section 40 to initiate transmission/reception of a signal with the band B (Step S3).

According to the present embodiment, the wireless circuit 1 is thus configured such that a second parameter of the impedance variable matching section 20 after the switching is set in accordance with a first parameter of the impedance variable matching section 20 before the switching, which first parameter is adjusted by the matching adjusting means in accordance with a communication status. This makes it possible to set, immediately after the switching, the parameter of the impedance variable matching section 20 to a set value in view of a communication environment, and therefore prevents the communication from being cut off when bands are switched.

(Example 1 of Table)

An example of the table, which is used by the control section 50, will be described in detail next. FIG. 3 is a view illustrating the table to be used when bands are switched in the present embodiment. As illustrated in FIG. 3, the table is configured such that (i) parameters A1, A2, and A3 are linked to a band A, (ii) parameters B1, B2, and B3 are linked to a band B, and (iii) the parameters A1, A2, and A3 are associated with the parameters B1, B2, and B3, respectively. In a case where the table is put to use, the matching adjusting means is preferably configured to select one of a plurality of values as a parameter of the impedance variable matching section 20 (e.g. one of the parameters A1, A2, and A3 is selected as a parameter for the band A).

Figure 4:
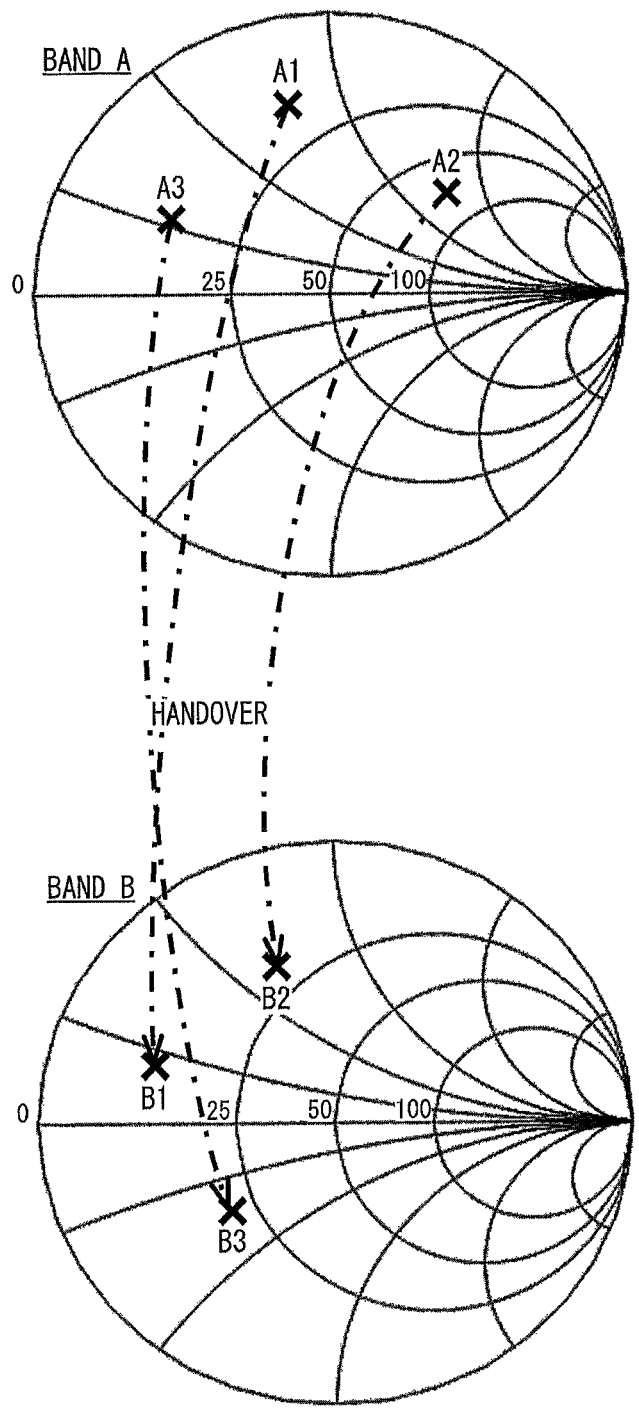
FIG. 4 is a view for describing an example in which a set value is set by use of the table information illustrated in FIG. 3.

In a case where a parameter (first matching value) of the impedance variable matching section 20 before switching from the band A to the band B is the parameter A1, the control section 50 obtains, as a parameter (second parameter) to be set after the switching, the parameter B1 which on the table (i) is associated with the parameter A1 linked to the band A and (ii) is linked to the band B. The control section 50 likewise operates in a case where the parameter of the impedance variable matching section 20 before the switching is the parameter A2 or A3. In other words, the control section 50, on the table, (i) searches, out of the parameters linked to the band A, for the parameter of the impedance variable matching section 20 before the switching and then (ii) obtains, as a parameter to be set after the switching, a parameter which is associated with a parameter obtained as a result of the search and which is linked to the band B. This allows the control section 50 to change the parameter of the impedance variable matching section 20 as illustrated in FIG. 4 during a handover or the like, for example.

Note that the table is, for example, preferably configured as follows: As illustrated in FIG. 3, it is preferable that (i) several external environments of device are anticipated in advance, (ii) corresponding optimum parameters in the band A and in the band B are calculated in advance, and (iii) the optimum parameters in the band A and the respective optimum parameters in the band B are associated with each other and are contained in the table. Examples of the external environment of device encompass a condition in which the device (wireless device) is being held by a hand, a condition in which the device is being used for a phone call (i.e. the device is being held against the head), a condition in which the device is being placed on a desk, and a condition in which the device is being placed on a charger. By calculating in advance optimum parameters in the band A and in the band B for such external environments and then associating the optimum parameters of the band A with the optimum parameters of the band B, it is possible to switch, during operation, to an optimum parameter of the band B by merely referring to the parameters adjusted in the band A without determining an external environment.

(Example 2 of Table)

Another example of the table, which is used by the control section 50, will be described in detail below. FIG. 5 is a showing another example of the table to be used when the bands are switched in the present embodiment. As illustrated in FIG. 5, the table is configured such that (i) parameter regions A1, A2, and A3 are linked to a band A, (ii) parameters B1, B2, and B3 are linked to a band B, and (iii) the parameter regions A1, A2, and A3 are associated with the parameters B1, B2, and B3, respectively. In a case where the table is put to use, the matching adjusting means may select one of a plurality of values as a parameter of the impedance variable matching section 20. Note, however, that the parameter of the impedance variable matching section 20 is preferably able to be set to any value.

Figure 6:
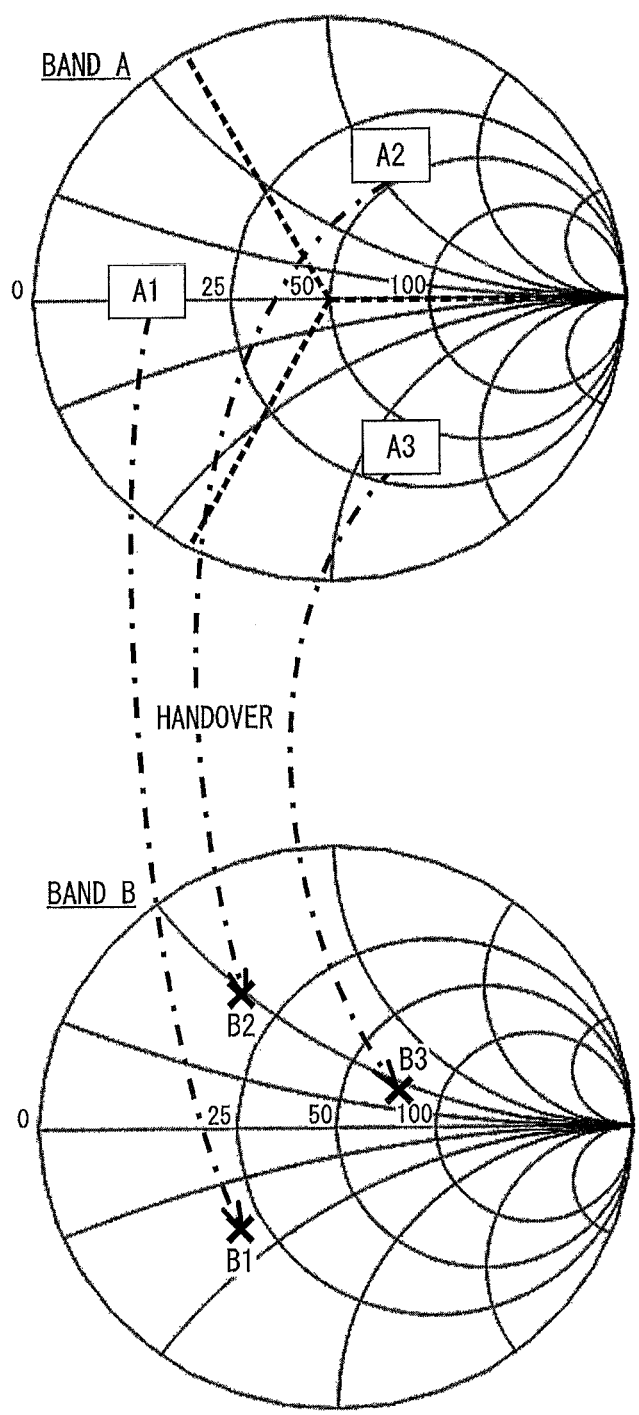
FIG. 6 is a view for describing an example in which a set value is set by use of the table information illustrated in FIG. 5.
Figure 7:
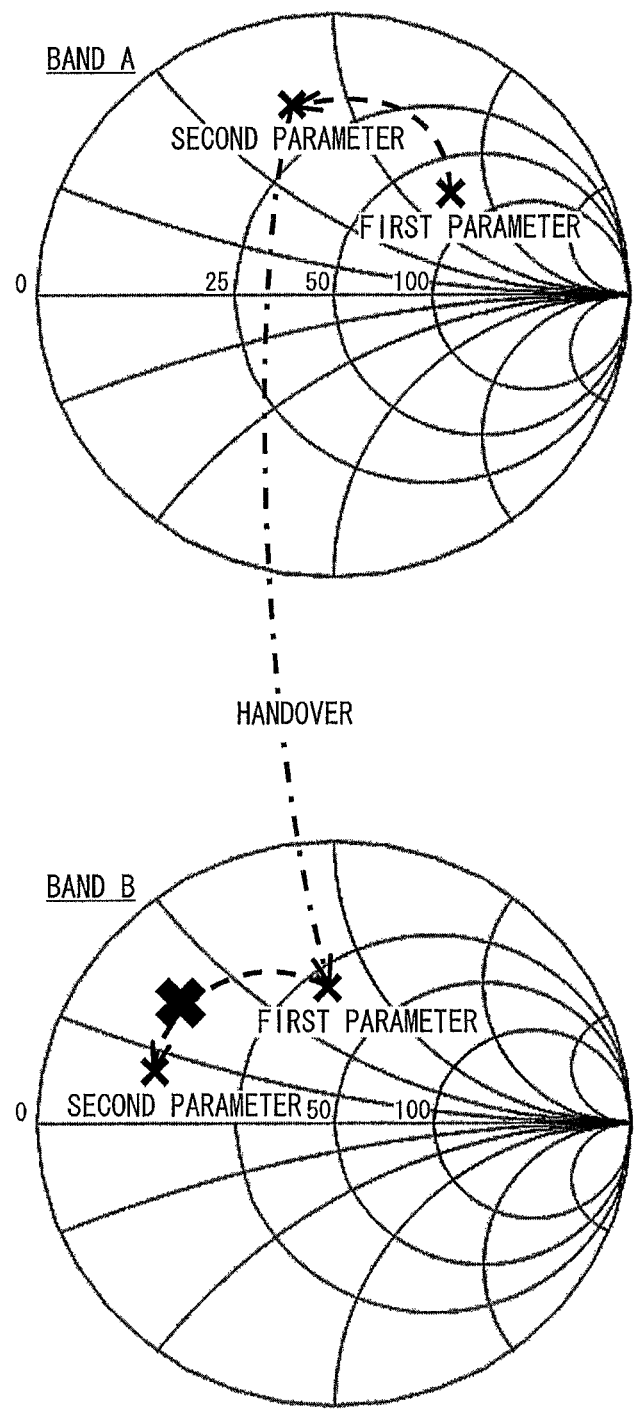
FIG. 7 is a view for describing an example in which a set value is set when use frequency bands are switched according to the conventional technology.

In a case where a parameter (first matching value) of the impedance variable matching section 20 before switching from the band A to the band B is a value included in the parameter region A1, the control section 50 obtains, as a parameter (second parameter) to be set after the switching, the parameter B1 which on the table (i) is associated with the parameter region A1 linked to the band A and (ii) is linked to the band B. The control section 50 likewise operates in a case where the parameter of the impedance variable matching section 20 before the switching is a value included in the parameter region A2 or A3. In other words, the control section 50, on the table, (i) searches, out of the parameter regions linked to the band A, for a parameter region in which the parameter of the impedance variable matching section 20 before the switching is included and then (ii) obtains, as a parameter to be set after the switching, a parameter which is associated with a region obtained as a result of the search and which is linked to the band B. This allows the control section 50 to change the parameter of the impedance variable matching section 20 as illustrated in FIG. 6 during a handover or the like, for example.

Note that the table is, for example, preferably configured as follows: As illustrated in FIG. 5, it is preferable that (i) several external environments of device are anticipated in advance, (ii) corresponding optimum parameters in the band A and in the band B are calculated in advance, (iii) parameter regions are defined in the band A to include the respective optimum parameters, and (iv) the parameter regions in the band A and the respective optimum parameters in the band B are associated with each other and are contained in the table. Examples of the external environment of device encompass a condition in which the device (wireless device) is being held by a hand, a condition in which the device is being used for a phone call (i.e. the device is being held against the head), a condition in which the device is being placed on a desk, and a condition in which the device is being placed on a charger. By calculating in advance optimum parameters in the band A and in the band B for such external environments and then associating the parameter regions (including the respective optimum parameters) of the band A with the optimum parameters of the band B, it is possible to switch, during operation, to an optimum parameter of the band B by merely referring to the parameters adjusted in the band A without determining an external environment. The parameter regions in the band A only need to be defined to include the optimum parameters that correspond to the respective external environments. Note, however, that the parameter regions are preferably adjusted by experiment such that transmission quality, for example, would be excellent.

SUMMARY

A wireless circuit in accordance with one aspect of the present invention is a wireless circuit to be connected to an antenna, said wireless circuit including: a variable matching section (impedance variable matching section 20) for changing, in accordance with a set value (parameter), an impedance between the antenna and the wireless circuit; matching adjusting means (impedance variable matching section 20) for adjusting, in accordance with a communication status, the set value of the variable matching section; and switching means (control section 50) for carrying out switching between use frequency bands (bands) of the wireless circuit, in a case where the switching means carries out switching between the use frequency bands of the wireless circuit, the switching means sets, based on a first set value of the variable matching section which first set value has been adjusted by the matching adjusting means before the switching, a set value of the variable matching section after the switching.

According to the configuration, the set value of the variable matching section after the switching is set in accordance with the first set value of the variable matching section which has been adjusted in accordance with the communication status before the switching. This makes it possible to set, immediately after the switching, a set value in view of a communication environment, and therefore prevents the communication from being cut off when use frequency bands are switched.

The wireless circuit can be configured such that: in a case where the switching means carries out switching between the use frequency bands of the wireless circuit from a first frequency band to a second frequency band, the switching means (i) obtains a second set value from the first set value by referring to table information (table) which is stored in advance in the switching means and (ii) sets the set value of the variable matching section to the second set value thus obtained; and the table information is configured to deliver the second set value in response to receipt of the first frequency band, the second frequency band, and the first set value.

According to the configuration, the switching means can properly obtain the second set value (which is a set value of the variable matching section to be set after the switching) by referring to the table information that is configured to deliver the second set value in response to receipt of the first frequency band, the second frequency band, and the first set value.

The wireless circuit can be configured such that, in the table information, the second set value linked to the second frequency band is associated with the first set value linked to the first frequency band.

According to the configuration, the first set value and the second set value are associated with each other in the table information. This allows the second set value to be efficiently determined when the first frequency band, the second frequency band, and the first set value are given.

The wireless circuit can be configured such that, in the table information, the second set value linked to the second frequency band is associated with a pre-set range which includes the first set value linked to the first frequency band.

According to the configuration, the second set value is associated in the table information with the pre-set range including the first set value. This allows the second set value to be efficiently determined when the first frequency band, the second frequency band, and the first set value are given.

The wireless circuit in accordance with the embodiment of the present invention can be configured such that the matching adjusting means adjusts the set value of the variable matching section to one of candidate values which are specified in advance for respective use frequency bands of the wireless circuit.

According to the configuration, the set value of the variable matching section can be quickly adjusted.

The wireless circuit can be configured such that the matching adjusting means adjusts the set value of the variable matching section to any value.

According to the configuration, the set value of the variable matching section can be properly adjusted.

The wireless circuit in accordance with the embodiment of the present invention can be configured to further include quality determining means for carrying out determination of quality of a transmitted signal, the matching adjusting means adjusts the set value of the variable matching section in accordance with a result of the determination carried out by the quality determining means.

According to the configuration, the matching adjusting means can adjust the set value of the variable matching section so as to increase the quality of a transmitted signal.

A wireless device in accordance with one aspect of the present invention includes the above wireless circuit.

With the configuration, it is possible to provide a wireless device capable of preventing communication from being cut off when use frequency bands are switched.

A method in accordance with one aspect of the present invention is a method of controlling a wireless circuit, said wireless circuit comprising: a variable matching section for changing, in accordance with a set value, an impedance between an antenna and the wireless circuit, said method comprising the steps of: (a) adjusting the set value of the variable matching section in accordance with a communication status; and (b) carrying out switching between use frequency bands of the wireless circuit, in the step (b), a set value of the variable matching section after the switching being set based on a first set value of the variable matching section which first set value has been adjusted in the step (a) before the switching.

The method brings about advantageous effects similar to those brought about by the above wireless circuit.

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention. In addition, a new technical feature can be obtained by combining together the technical means disclosed in the embodiments.

[Example of Realizing Blocks by Software]

Each block of the wireless circuit 1, particularly (i) the control section 50 and (ii) the impedance variable matching section 20 serving as matching adjusting means, may be realized by hardware such as a logic circuit provided in an integrated circuit (IC chip) or may be realized by software as executed by a CPU (Central Processing Unit).

In the latter case, the wireless circuit 1 includes (I) a CPU for executing a command of a program for achieving a function, (II) storage devices (storage media) such as (i) a ROM (Read Only Memory) for storing the program, (ii) a RAM (Random Access Memory) for extracting the program, (iii) a memory for storing the program and various types of data, and (III) the like. The object of the present invention can also be attained by (a) providing a storage medium in the wireless circuit 1, the storage medium having stored (in a computer-readable manner) program codes (executable program, intermediate code program, and source program) of a control program for the wireless circuit 1, which control program is a piece of software for achieving the function and (b) causing the computer (or CPU or MPU) to read out and then execute the program codes thus stored in the storage medium.

As the storage medium, a non-transitory tangible medium can be used. Examples of the non-transitory tangible medium encompass (i) tapes such as a magnetic tape and a cassette tape, (ii) disks including magnetic disks such as a Floppy Disk® and a hard disk and optical disks such as a CD-ROM, an MO, an MD, a DVD, and a CD-R, (iii) cards such as an IC card (including a memory card) and an optical card, (iv) semiconductor memories such as a mask ROM, an EPROM, an EEPROM (Registered Trademark), and a flash ROM, and (v) logic circuits such as a PLD (Programmable logic device) and an FPGA (Field Programmable Gate Array).

Furthermore, the wireless circuit 1 can be made connectable to a communications network so as to supply the program code via the communications network. The communications network is not limited to any particular one, provided that the program code can be transmitted via the communications network. Examples of the communications network encompass the Internet, an intranet, an extranet, a LAN, an ISDN, a VAN, a CATV communications network, a virtual dedicated network (virtual private network), a telephone line network, a mobile communications network, and a satellite communications network. A transfer medium for constituting the communications network only needs to be a medium via which the program code can be transmitted, and is not limited to any particular configuration or any type. Examples of the transfer medium encompass (i) wired lines such as IEEE 1394, a USB, an electric power line, a cable TV line, a telephone line, and an ADSL (Asymmetric Digital Subscriber Line) and (ii) wireless communications such as an infrared radiation (e.g. IrDA and remote control), Bluetooth (Registered Trademark), IEEE 802.11 wireless, HDR (High Data Rate), NFC (Near Field Communication), DLNA (Digital Living Network Alliance), a mobile telephone network, a satellite line, and a terrestrial digital network. Note that the present invention can be realized in the form of a computer data signal which is realized by electronic transmission of the program code and which is embedded in a carrier wave.

INDUSTRIAL APPLICABILITY

The present invention can be used in the field of wireless device production.

REFERENCE SIGNS LIST

1 Wireless circuit
10 Antenna
20 Impedance variable matching section (variable matching section, matching adjusting means)
30 Switching section
31, 33 Duplexer section
32, 34 Amplifier
40 Radio signal processing section
50 Control section (switching means)
55 Storage section

The invention claimed is:
1. A wireless circuit to be connected to an antenna, said wireless circuit comprising:
a variable matching section for changing, in accordance with a set value, an impedance between the antenna and the wireless circuit;
matching adjusting means for adjusting, in accordance with a communication status, the set value of the variable matching section; and
switching means for carrying out switching from a first to a second use frequency bands of the wireless circuit,
the switching means storing therein table information in advance,
in a case where the switching means carries out the switching from the first to the second use frequency bands of the wireless circuit, the switching means (I) obtaining a second set value of the variable matching section which second set value is to be set after the switching, from (i) a first set value of the variable matching section which first set value has been adjusted by the matching adjusting means before the switching, ii) the first use frequency band from which the switching is carried out, and (iii) the second use frequency band to which the switching is carried out, by referring to the table information and (II) setting the second set value to the variable matching section, and
the table information being configured to deliver the second set value of the variable matching section which second set value is to be set after the switching, in response to receipt of the first use frequency band from which the switching is carried out, the second use frequency band to which the switching is carried out, and the first set value of the variable matching section which first set value has been set before the switching.

2. The wireless circuit as set forth in claim 1, wherein the matching adjusting means adjusts the set value of the variable matching section to one of candidate values which are specified in advance for the respective first and second use frequency bands of the wireless circuit.

3. The wireless circuit as set forth in claim 1, wherein the matching adjusting means adjusts the set value of the variable matching section to any value.

4. A wireless circuit as set forth in claim 1, further comprising:
quality determining means for carrying out determination of quality of a transmitted signal,
the matching adjusting means adjusts the set value of the variable matching section in accordance with a result of the determination carried out by the quality determining means.

5. The wireless circuit as set forth in claim 1, wherein, in the table information, the second set value of the variable matching section which second set value is to be set after the switching and which is linked to the second use frequency band is associated with the first set value of the variable matching section which first set value has been set before the switching and which is linked to the first use frequency band.

6. The wireless circuit as set forth in claim 1, wherein, in the table information, the second set value of the variable matching section which second set value is to be set after the switching and which is linked to the second use frequency band is associated with a pre-set range which includes the first set value of the variable matching section which first set value has been set before the switching and which is linked to the first use frequency band.

7. A method of controlling a wireless circuit,
said wireless circuit comprising:
a variable matching section for changing, in accordance with a set value, an impedance between an antenna and the wireless circuit, said method comprising the steps of:
(a) adjusting the set value of the variable matching section in accordance with a communication status; and
(b) carrying out switching from a first to a second use frequency bands of the wireless circuit, in the step (b), a second set value of the variable matching section which second set value is to be set after the switching being (I) obtained, from (i) a first set value of the variable matching section which first set value has been adjusted in the step (a) before the switching, (ii) the first use frequency band from which the switching is carried out, and (iii) the second use frequency band to which the switching is carried out, by referring to table information and (II) set to the variable matching section, and the table information being configured to deliver the second set value of the variable matching section which second set value is to be set after the switching, in response to receipt of the first use frequency band from which the switching is carried out, the second use frequency band to which the switching is carried out, and the first set value of the variable matching section which first set value has been set before the switching.

\* \* \* \* \*